IMAGE FREQUENCY ATTENUATION CIRCUIT

Filed April 27, 1964

INVENTOR.
JOHN F. BERES
BY
Herbert Epstein
ATTORNEY 3,372,337

IMAGE FREQUENCY ATTENUATION CIRCUIT

John F. Beres, Southampton, Pa., assignor to Philco-Ford Corporation, a corporation of Delaware Filed Apr. 27, 1964, Ser. No. 362,781
19 Claims. (Cl. 325—388)

ABSTRACT OF THE DISCLOSURE

An image frequency attenuation circuit comprising a tuning branch series-resonant at the frequency of a desired signal and a reactive branch shunted across the tuning branch. The tuning branch and the reactive branch form, in combination, a circuit which is parallel-resonant at approximately the frequency of the signal to be attenuated.

This invention relates to an improved circuit for selectively transmitting, to the input stage of a receiver of periodically-varying electrical signals, an input signal having a given frequency, and for simultaneously selectively reducing transmission to said stage of an input signal having a frequency differing from said given frequency by a given amount. This improved circuit is particularly useful in superheterodyne receivers, where it serves selectively to transmit to the R.-F. amplifier or frequency converter thereof a desired signal having a frequency within a given frequency range, e.g. the standard broadcast band, while simultaneously reducing transmission thereto of image signals.

As is well known, in a conventional superheterodyne receiver, an input signal the reception of which is desired is selectively transmitted to a frequency converter by a tuning circuit resonant at the frequency of the desired signal. Simultaneously, a heterodyning signal, the frequency of which differs from that of the desired signal by a substantially constant amount, is supplied to the frequency converter by a local oscillator. In response to the desired signal and the heterodyning signal, the frequency converter produces an output signal the frequency of which is equal to the difference between the respective frequencies of the received signal and the heterodyning signal, i.e., to said constant amount. This output signal is termed the intermediate-frequency signal and said constant amount is termed the intermediate frequency. The intermediate frequency signal is then supplied, via one or more amplifiers tuned to the intermediate frequency, to a demodulator which extracts from the intermediate frequency signal the intelligence signal with which the desired signal was modulated. The intelligence signal is then supplied to an appropriate reproducer (e.g., a loudspeaker or a control element of a television picture tube).

To achieve undistorted reproduction of the intelligence signal, it is necessary that no other signal having frequencies in the frequency range to which the reproducer is responsive be supplied thereto. However, because the frequency converter generates, in response to any input signal, an output signal the frequency of which is equal to the difference in the respective frequencies of said input signal and the heterodyning signal, the converter will generate an output signal of intermediate frequency not only in response to the desired input signal but also in response to an undesired input signal the frequency of which differs from the frequency of the desired signal by twice the intermediate frequency and differs from the frequency of the heterodyning signal by the intermediate frequency. Such an undesired signal is termed an image signal and is typically a signal transmitted by another broadcasting station. When the frequency of the heterodyning signal is higher than the frequency of the desired signal by the intermediate frequency, then the frequency of the image signal, i.e., the image frequency, is higher than the frequency of the desired signal by twice the intermediate frequency. When the frequency of the heterodyning signal is lower than the frequency of the desired signal by the intermediate frequency, then the image frequency is lower than the frequency of the desired signal by twice the intermediate frequency. Because the frequency converter produces an output signal of intermediate frequency in response to the undesired image signal, the I-F amplifiers supply this output signal to the demodulator, together with the intermediate frequency signal corresponding to the desired signal. If the image signal is modulated in the same manner as the desired signal (e.g., both are amplitude modulated or both are frequency modulated), the demodulator demodulates them both and transmits to the reproducer not only the desired intelligence signal extracted from the desired signal but also the undesired intelligence signal extracted from the image signal. As a result, the reproduction of the desired intelligence contained in the desired intelligence signal is distorted by the simultaneous reproduction of the undesired intelligence contained in the undesired intelligence signal derived from the image signal.

To reduce the transmission of image signals to the frequency converter of the receiver (which transmission may occur to an appreciable extent, in the case of strong image signals, even though a resonant circuit is used to tune the input of the receiver to the desired signal), the art has proposed interposing a filter network between the antenna or other signal source and the frequency converter, which network not only selectively transmits the desired signal to the converter stage but also selectively reduces transmission thereto of the image signal. In one such network, an antenna capacitor connects the antenna to a point at ground potential, a variable inductor connects the antenna to the grid of the input tube of the receiver, and a trimmer capacitor connects the grid to said point at ground potential. These two capacitors and the inductor form a circuit which is resonated with the desired signal by appropriate adjustment of the inductor. To reduce transmission of image signals to the grid of the input tube, the combination of a fixed inductor and a fixed capacitor, connected in series relationship, is shunted across the variable inductor. The two inductors and the fixed capacitor have respective values such that the two-branch circuit formed thereby is parallel-resonant at approximately the image frequency when the circuit comprising the variable inductor, the antenna capacitor and the trimmer capacitor is resonant at the frequency of the desired signal. Because this two-branch circuit, connected in series relationship with the antenna and the grid of the input tube, presents a very high impedance to image signals, it reduces transmission of image signals from the antenna to the grid of the input tube.

The aforedescribed prior-art circuit is disadvantageous because the series combination of the fixed inductor and fixed capacitor shunting the variable inductor generally has an impedance comparable to that of the variable inductor. Hence this series combination substantially affects the tracking of the tuning circuit (consisting of the variable inductor, the antenna capacitor and the trimmer capacitor) with the local oscillator. As a result, a specially designed (and hence expensive) variable inductor is required to achieve tracking between the tuning circuit and the local oscillator. In addition, even slight variations in the value of said series combination changes the tuning characteristics of the tuning circuit and hence complicates the alignment of receivers employing this prior-art arrangement.

Accordingly an object of the invention is to provide improved receivers, in particular, improved superheterodyne receivers, for periodically-varying electrical signals.

Another object is to provide an improved circuit for selectively transmitting to the input stage of a receiver an input signal having a given frequency and for simultaneously selectively reducing transmission to said stage of an input signal having a frequency differing from said given frequency by a given amount.

Another object is to provide a circuit of the foregoing kind which is particularly well suited for operation in conjunction with an input stage having a low input impedance.

Another object is to provide an improved circuit for selectively transmitting, to the frequency converter of a superheterodyne receiver, a signal having a given frequency and for simultaneously selectively reducing transmission thereto of a signal of image frequency.

Another object is to provide an improved circuit of the foregoing kind which requires no specially-designed components and is readily aligned.

The foregoing objects are achieved, in a receiver of periodically-varying electrical signals comprising an input stage and means coupled to said input stage for selectively transmitting thereto an input signal having a given frequency and for simultaneously selectively reducing transmission to said stage of an input signal having a frequency differing from said given frequency by a given amount, by including in said means (1) a circuit series-resonant at said given frequency and (2) reactive means connected in shunt with said series-resonant means and forming in combination therewith a circuit parallel-resonant at approximately said differing frequency. The series-resonant means typically comprises a first inductor and a first capacitor connected in series relationship between a source of input signals and the input stage of the receiver (which typically is a radio-frequency amplifier or frequency converter of a superheterodyne receiver). Either the inductor or the capacitor is variable, so that the series-resonant means is tunable to the frequency of the desired incoming signal. In a superheterodyne receiver, the variable component may be ganged in conventional manner to the tuning control of the local oscillator. The reactive means which is connected in shunt with this series circuit typically comprises a second capacitor, a second inductor, or a second inductor and a second capacitor connected in series relationship.

Because the impedance of the series-resonant circuit is extremely low at its resonant frequency (i.e., the frequency to which the receiver is tuned thereby), the series-resonant circuit transmits the desired signal, without substantial attenuation, to the input stage of the receiver. Moreover, as a feature of the invention, because the series-resonant circuit has an extremely low impedance at its resonant frequency, the reactive means shunted thereacross, which is not series-resonant at the latter frequency and has a much higher impedance thereat than the series-resonant circuit, has no significant effect on the tuning characteristics of the series-resonant circuit. Hence the reactive means has no significant effect on the tracking of the series-resonant circuit with the local oscillator. In addition, because the series-resonant circuit has an extremely low impedance at its resonant frequency, it can be used to supply the desired signal efficiently and with good selectivity to an input stage having a low input impedance, such as a common-emitter transistor amplifier, as well as to a stage having a high input impedance, such as a vacuum-tube amplifier operating under Class A conditions.

Other advantages and features of the invention will become apparent from a consideration of the following detailed description taken in connection with the accompanying drawings, in which.

Figure 1:
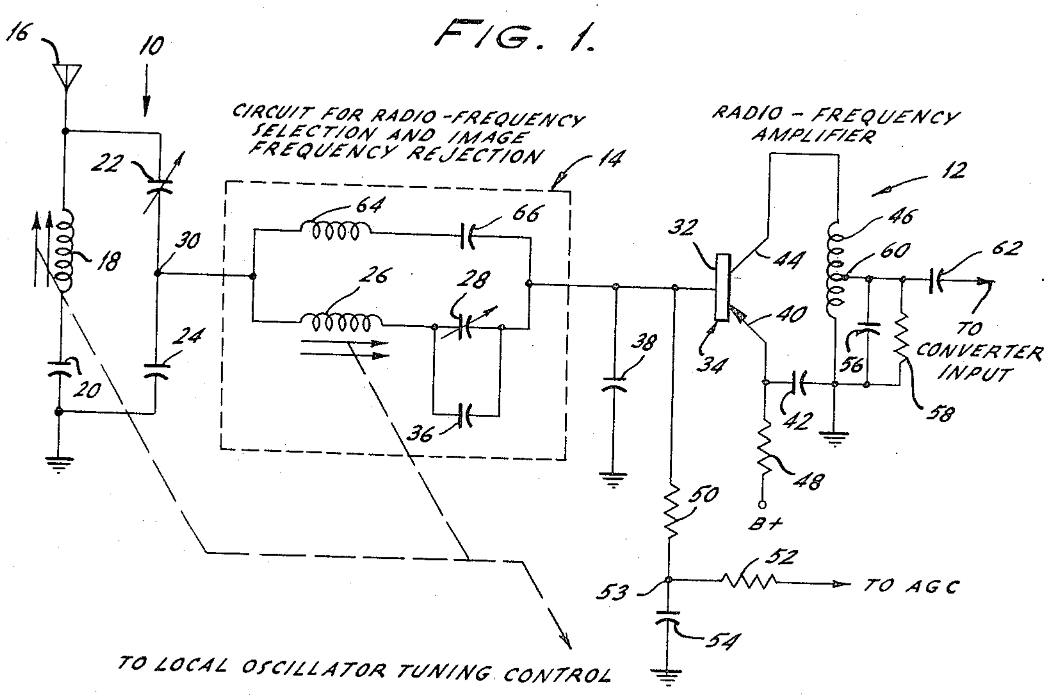
FIG. 1 is a schematic diagram of an input circuit of a superheterodyne receiver, comprising a circuit according to the invention.

The input circuit schematically diagrammed in FIG. 1 comprises a source 10 of input signals, a radio frequency amplifier 12, to which the input signal desired to be received is to be transmitted, and a circuit 14 according to the invention, for selectively transmitting from source 10 to the input of amplifier 12 the input signal desired to be received while simultaneously reducing transmission thereto of any image signal. In addition to the circuits diagrammed in FIG. 1, the receiver typically also comprises a frequency converter (to which amplifier 12 supplies an amplified replica of the input signal transmitted thereto by circuit 14), a local oscillator for supplying to the frequency converter a heterodyning signal having a frequency higher than the frequency of the desired signal by an amount equal to the intermediate frequency of the receiver, one or more intermediate-frequency amplifiers, a detector, an amplifier for the detected signal and reproducing means (e.g., a loudspeaker or a cathode ray tube). Because all of these additional circuits and components may be of conventional structure and interconnected in conventional manner, they have not been illustrated in the drawings.

Source 10 comprises an antenna 16, and a variable inductor 18 and a capacitor 20 connected in series relationship between antenna 16 and a point at reference potential. Source 10 also comprises a trimmer capacitor 22 and a coupling capacitor 24 connected in series relationship between antenna 16 and said point at reference potential. The network comprising variable inductor 18 and capacitors 20, 22 and 24 is tuned to parallel-resonance at the frequency of the desired signal. In addition, the combination of inductor 18 and capacitor 20 is series-resonant at a frequency below the resonant frequency of the network and hence serves to increase the selectivity of source 10. The output signal supplied by source 10 to circuit 14 is developed across capacitor 24, which preferably has a value such that its impedance is low over the range of frequencies to which the receiver is tunable.

Circuit 14 comprises a variable inductor 26 and a trimmer capacitor 28 connected in series relationship between the junction 30 of capacitors 22 and 24 and the base electrode 32 of a transistor 34 of amplifier 12. A small-valued capacitor 36, connected in parallel relationship with capacitor 28, provides temperature compensation therefor. An output capacitor 38 is connected between base 32 and a point at reference potential. Capacitor 38 preferably has a value such that its impedance is low over the range of frequencies to which the receiver is tunable.

In amplifier 12, transistor 34 is connected in common-emitter configuration, its emitter 40 being connected to a point of reference potential via a bypass capacitor 42 and its collector 44 being connected to said point at reference potential via an output inductor 46. A stabilizing resistor 48 connects emitter 40 to a source of operating potential designated B+, and resistors 50 and 52 connect base electrode 32 to a source of an AGC signal. The junction 53 of resistors 50 and 52 is bypassed to the point of reference potential by an AGC filter capacitor 54. A capacitor 56 and a resistor 58, both of which are connected between a tap 60 on inductor 46 and the point at reference potential, form with inductor 46 a bandpass filter having a passband approximately coextensive with the tuning range of the receiver. A capacitor 62, connected to tap 60, supplies the output signal of amplifier 12 to the frequency converter (not shown). The inductance-varying elements of variable inductors 18 and 26 (e.g., powdered-iron, permeability-tuning cores) are ganged in conventional fashion to the frequency control of the local oscillator (not shown) and the receiver is tuned to a desired signal within the tuning range of the receiver by appropriate concurrent adjustment of the inductances of inductors 18 and 26 and the frequency control of the local oscillator.

Source 10 and the series-resonant circuit comprising variable inductor 26 and capacitors 28 and 36 selectively transmit to amplifier 12 signals the frequency of which is substantilaly the same as the frequency to which these selective circuits are tuned, and discriminate against signals having other frequencies. However, if a sufficiently strong image signal is received by antenna 16, an appreciable portion thereof is transmitted by these selective circuits to the frequency converter and, when demodulated, distorts the intelligence reproduced by the receiver in response to the desired signal.

In accordance with the invention, the transmission of image signals from antenna 16 to amplifier 12 is greatly reduced by connecting a reactive circuit in shunt with series-resonant circuit 26, 28 and 36. In the embodiment shown in FIG. 1, this reactive circuit comprises an inductor 64 and a capacitor 66, connected in series relationship, which have respective values such that circuit 14 is approximately parallel-resonant at the image frequency. Because circuit 14 is approximately parallel-resonant at the image frequency, it presents an extremely high impedance to image signals (while simultaneously presenting an extremely low impedance to signals whose frequency is the same as the series-resonant frequency of circuit 26, 28, 36). Hence circuit 14 greatly reduces the transmission of image signals from antenna 16 to base 32 of transistor 34, i.e., the input of amplifier 12. Moreover, because circuit 26, 28, 36 has an extremely low impedance at its resonant frequency, and in particular has a much lower impedance at this frequency than the combination consisting of inductor 64 and capacitor 66, the latter combination has substantially no effect on the tuning of circuit 26, 28, 36. According, inductor 64 and capacitor 66, while coacting in accordance with the invention with inductor 26 and capacitors 28 and 36 to reduce markedly the transmission of image signals from antenna 16 to amplifier 12, have no substantial effect on the tracking of circuit 14 with source 10 and the local oscillator. Hence variable inductor 26 may have a conventional structure and the receiver may be readily aligned using conventional techniques.

For best rejection of image signals over the entire tuning range of the receiver, inductors 26 and 64 and capacitors 28, 36 and 66 of circuit 14 have respective values such that circuit 14 is precisely parallel-resonant at the image frequency when the combination of inductor 26 and capacitors 28 and 36 is series-resonant at a frequency at or near the center of said tuning range (e.g., at a frequency between 1000 and 1100 kilocycles per second, when the tuning is 540 to 1610 kilocycles per second). In addition, inductor 64 and capacitor 66 have respective values such that they series-resonate at a frequency substantially higher than the image frequency corresponding to the highest frequency in the tuning range of the receiver. For example, for a receiver in which the highest tunable frequency is 1610 kilocycles per scecond and the corresponding image frequency is 2135 kilocycles per second, the combination of inductor 64 and capacitor 66 typically is series-resonant between 2.7 and 2.8 megacycles per second. When inductor 64 and capacitor 66 series-resonate at a frequency substantially higher than the highest image frequency, two desirable results are obtained. (1) The capacitive reactance of the combination of inductor 64 and capacitor 66 increases with decreasing image frequency. This increase in capacitive reactance tends to compensate for the increase in the inductive reactance circuit 26, 28, 36 occurring when circuit 26, 28, 36 is series-resonated at progressively lower signal frequencies and the image frequency is correspondingly lowered. Hence this increase in capacitive reactance tends to maintain circuit 14 parallel-resonant at or near the image frequency over the entire tuning range of the receiver. Under these conditions, where (as aforementioned) circuit 14 is constructed to be parallel-resonant at exactly the image frequency when combination 26, 28, 36 thereof is tuned to a frequency at or near the center of the tuning range, circuit 14 provides considerable rejection of image signals even when the combination 26, 28, 36 is tuned to any other frequency within the tuning range. (2) When circuit 64, 66 is series-resonant at a frequency substantially higher than the highest image frequency, it presents a high impedance to all signals having frequencies within either the tuning range of the receiver or the range of image frequencies corresponding to this tuning range, and hence inhibits the undesired transmission of such signals through inductor 64 and capacitor 66.

In view of the foregoing discussion, the criteria of selecting specific values for the components of the circuit shown in FIG. 1 will be apparent to those skilled in the art.

Capacitor 38 preferably has a capacitance much higher than the sum of the capacitances of capacitors 28 and 36, e.g., more than ten times higher, and such as to have an impedance lower than the input impedance of the base-emitter path of transistor 34. When capacitor 38 has such a capacitance, it has substantially no effect on the resonant frequency of series-resonant circuit 26, 28, 36 or circuit 14 and it prevents amplifier 12 from loading significantly source 10 or circuit 14.

In one receiver embodying the invention, having a tuning range of 540 kilocycles to 1610 kilocycles, an intermediate frequency of 262.5 kilocycles and a heterodyning signal the frequency of which is higher than that of the desired signal, the components of the circuit of FIG. 1 typically have the following values. It is to be understood that these values are merely illustrative and that the invention is not limited thereto.

| Component: | | Value |
|---|---|---|
| Inductor 18 | microhenries | 140–1200 |
| Inductor 26 | do | 80–700 |
| Inductor 46 | millihenries | 1.3 |
| Inductor 64 | microhenries | 80 |
| Capacitor 20 | picofarads | 150 |
| Capacitor 22 (nominal value) | do | 80 |
| Capacitor 24 (for an antenna 16 presenting a capacity of about 70 picofarads) | picofarads | 3600 |
| Capacitor 28 (nominal value) | do | 73 |
| Capacitor 36 | do | 47 |
| Capacitor 38 | do | 1500 |
| Capacitor 42 | microfarads | 0.1 |
| Capacitor 54 | do | 0.22 |
| Capacitor 56 | do | 0.0047 |
| Capacitor 62 | do | 0.0068 |
| Capacitor 66 | picofarads | 47 |
| Resistor 48 | ohms | 470 |
| Resistor 50 | kilohms | 2.2 |
| Resistor 52 | do | 1 |
| Resistor 58 | ohms | 56 |
| Transistor 34 | | Toshiba Type 2SA72 |
| B+ | volts | 11.5 |

The ability of the radio-frequency input circuit of a superheterodyne receiver to discriminate against image signals is conventionally specified in terms of the "image ratio" of the receiver, i.e., the ratio of (1) the field strength at the image frequency to (2) the field strength at the desired frequency, each field being applied in turn to the antenna of the receiver, which, under specified conditions, cause the receiver to produce equal outputs. (See Proceedings of the Institute of Radio Engineers, volume 40, page 1683 (1952).) The outputs may be measured, for example, in terms of the amplitudes of the respective signals supplied to the reproducer (not shown) by the preceding stages of the receiver in response to the respective fields applied to antenna 16, or the amplitudes of the respective signals supplied by source 10 and R-F amplifier 12 to the frequency converter (not shown) in response to said fields. A receiver comprising components having the above-listed specific values typically exhibits an image ratio of 9000 when tuned to 540 kilocycles per second, an image ratio of between 30,000 and 40,000 when tuned to 1100 kilocycles per second (for which tuning, circuit 14 is precisely parallel-resonant at the image frequency), and an image ratio of 5000 when tuned to 1610 kilocycles per second. By contrast, when inductor 64 and capacitor 66 are disconnected from inductor 26 and capacitor 28, the image ratio at 540 kilocycles per second falls to 6000, the image ratio at 1100 kilocycles per second falls to 2000, and the image ratio at 1610 kilocycles per second falls to 900. These results show that circuit 14 improves greatly the ability of superheterodyne receivers embodying it to discriminate against image signals.

The invention may also be embodied in structures differing from that depicted in FIG. 1. For example, radio-frequency amplifier 12 may be omitted and circuit 14 coupled directly to the frequency converter of the receiver. In addition, the thermal compensation capacitor 36 may be omitted. When capacitor 36 is omitted, the value of capacitor 28 is increased sufficiently to supply the capacitance formerly supplied by capacitor 36.

Figure 2:
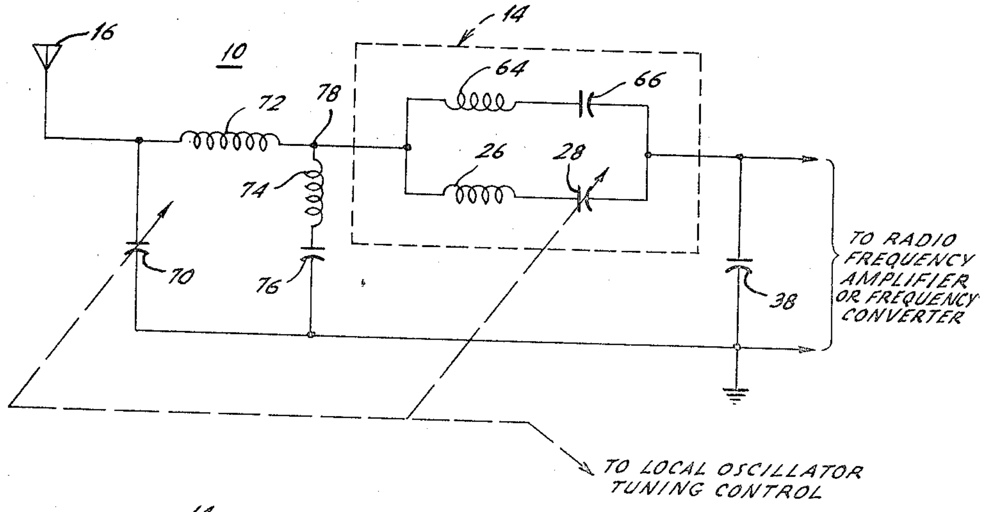
FIG. 2 is a schematic diagram of another input circuit comprising a circuit according to the invention.

Moreover, when the heterodyning frequency is lower than the frequency of the desired signal (and hence the image frequency also is lower than the frequency of the desired signal), capacitor 28 may be variable and inductor 26 may be fixed. Such an embodiment is shown in FIG. 2. When capacitive tuning is employed in circuit 14, good image rejection over the tuning range of the receiver is achieved when inductor 64 and capacitor 66 have respective value such that (1) the combination of inductor 64 and capacitor 66 series-resonates below the image frequency range of the receiver and (2) circuit 14 is precisely parallel-resonant at the image frequency when circuit 26, 28, 36 is series-resonant at a frequency approximately in the center of the tuning range of the receiver.

Source 10 need not have the specific circuit configuration shown in FIG. 1. For example, as shown in FIG. 2, source 10 may comprise a variable tuning capacitor 70 connecting antenna 16 to a point at reference potential and ganged to the tuning controls of capacitor 28 and the local oscillator, an inductor 72 connecting antenna 16 to circuit 14, and another inductor 74 and a capacitor 76 serially connected between junction 78 and the point at reference potential. To bypass input signals of intermediate frequency to the point at reference potential and prevent their transmission through inductor 64 and capacitor 66, the combination of inductor 74 and capacitor 76 may be series-resonated at the intermediate frequency.

Figure 3:
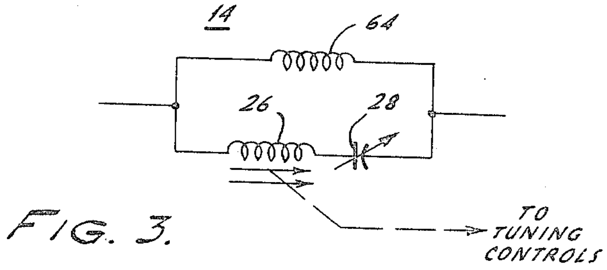
FIG. 3 is a schematic diagram of another circuit according to the invention.

In the embodiments of FIGS. 1 and 2, the reactive means connected in shunt with inductor 26 and capacitor 28 comprises inductor 64 and capacitor 66. However, when the image frequency is lower than the frequency of the desired signal (i.e., in a receiver in which the heterodyning frequency is lower than that of the desired signal) and the tuning range of the receiver is relatively narrow, the reactive means in FIGS. 1 and 2 shunting inductor 26 and capacitor 28 may consist solely of inductor 64. Such an arrangement is shown in FIG. 3. Conversely, when the image frequency is higher than the signal frequency and the tuning range of the receiver is relatively narrow, the reactive means may consist solely of a capacitor. (This embodiment is not shown in the drawings.) A reactive means consisting solely of a capacitor is not preferred in the embodiment of FIG. 1, because, together with capacitor 22, such a capacitor would provide a low-impedance path for high-frequency electrical noise (e.g. static) from antenna 16 to amplifier 12. However, when (as in FIG. 2) a network having an inductor connected in series relationship with the signal path is employed for preselection, this noise problem becomes less significant.

In addition, although the reactive means has been described heretofore as either an inductor, or a capacitor, or an inductor and a capacitor connected in series relationship, the reactive means may alternatively comprise a more complex reactive circuit the impedance of which at successive image frequencies is opposite in signand even more nearly equal in magnitude to the impedance, at said successive image frequencies, of combination 26, 28, 36, than are the respective impedances of the reactive means described hereinbefore.

The foregoing discussion has been directed to the invention as embodied in a superheterodyne receiver. However, circuit 14 can be employed in a non-superheterodyne receiver, e.g. a tuned-radio-frequency receiver, to reduce transmission of a signal of undesired frequency to the input stage thereof while readily transmitting thereto a desired signal the frequency of which differs from that of the undesired signal by a given frequency increment. For example, circuit 14 can be used, in a receiver tuned to a fixed frequency, selctively to transmit signals of said fixed frequency while selectively reducing transmission of undesired signals the frequency of which differs by a constant amount from said fixed frequency.

Moreover, while in FIGS. 1 and 2, circuit 14 is shown preceded by a tuned source 10, it is not essential that source 10 be tuned. Preferably source 10 is constructed to have a low output impedance, so that the signal path comprising source 10, inductor 26 and capacitors 28 and 36 (FIG. 1) has a low impedance at the resonant frequency of circuit 26, 28 and 36 and a very much higher impedance at other frequencies, and the signal path is consequently sharply selective.

While I have described my invention by means of specific examples and in specific embodiments, I do not wish to be limited thereto, for obvious modifications will occur to those skilled in the art without departing from the scope of my invention.

What I claim is:

1. In a receiver of periodically-varying electrical signals, comprising an input stage and means coupled to said input stage for selectively transmitting to said stage an input signal having a given frequency and for simultaneously selectively reducing transmission to said stage of an input signal having a frequency differing from said given frequency by a given amount, the improvements wherein said means comprises means series-resonant at said given frequency, and reactive means connected in shunt with said series-resonant means and forming in combination therewith a circuit parallel-resonant at approximately said differing frequency.

2. A receiver according to claim 1, wherein said series-resonant means comprises inductive means and capacitive means connected in series relationship and said reactive means comprises inductive means.

3. A receiver according to claim 1, wherein said series-resonant means comprises first inductor and a first capacitor connected in series relationship.

4. A receiver according to claim 3, wherein said reactive means comprises a second inductor.

5. A receiver according to claim 3, wherein said reactive means comprises a second inductor and a second capacitor connected in series relationship, said series-connected second inductor and second capacitor shunting said series-connected first inductor and first capacitor.

6. A receiver according to claim 3, wherein said first inductor comprises means for varying its inductance.

7. A receiver according to claim 3, wherein said first capacitor comprises means for varying its capacitance.

8. A receiver according to claim 3, wherein said first inductor comprises means for varying its inductance and said reactive means comprises a second inductor shunting said series-connected first inductor and first capacitor.

9. In a superheterodyne receiver comprising a source of both a first alternating signal having a given frequency and a second alternating signal having a frequency differing from said given frequency by twice the intermediate frequency of said superheterodyne receiver, and means coupled to said source for selectively transmitting from said source to the input of a frequency converter of said receiver a signal having said given frequency and for simultaneously selectively reducing transmission from said source to said input of a signal having said differing frequency, the improvement wherein said means comprises means series-resonant at said given frequency, and reactive means connected in shunt with said series-resonant means and forming in combination therewith a circuit-parallel-resonant at approximately said differing frequency.

10. A superheterodyne receiver according to claim 9, wherein said series-resonant means comprises inductive means and capacitive means connected in series relationship and said reactive means comprises inductive means.

11. A superheterodyne receiver according to claim 9, wherein said series-resonant means comprises a first inductor and a first capacitor connected in series relationship, one of said first inductor and first capacitor comprising means for varying its value.

12. A superheterodyne receiver according to claim 11, wherein said reactive means comprises a second inductor.

13. A superheterodyne receiver according to claim 11, wherein said reactive means comprises a second inductor and a second capacitor connected in series relationship, said series-connected second inductor and second capacitor shunting said series-connected first inductor and first capacitor.

14. A superheterodyne receiver according to claim 11, wherein said first inductor comprises means for varying its inductance and said receiver comprises means coupling said inductance-varying means to the means for tuning the local oscillator of said receiver.

15. A superheterodyne receiver according to claim 11, wherein said first capacitor comprises means for varying its capacitance and said receiver comprises means coupling said capacitance-varying means to the means for tuning the local oscillator of said receiver.

16. A superheterodyne receiver according to claim 11, wherein said first inductor comprises means for varying its inductance, said receiver comprises means for coupling said inductance-varying means to the means for tuning the local oscillator of said receiver, and said reactive means comprises a second inductor shunting said series-connected first inductor and first capacitor.

17. A superheterodyne receiver according to claim 11, wherein said first inductor comprises means for varying its inductance, said receiver comprises means for coupling said inductance-varying means to the means for tuning the local oscillator of the receiver, and said reactive means comprises a second inductor and a second capacitor connected in series relationship, said series-connected second inductor and second capacitor shunting said series-connected first inductor and first capacitor.

18. In a superheterodyne receiver comprising a source of both a first alternating signal having a given frequency and a second alternating signal having a frequency differing from said given frequency by twice the intermediate frequency of said receiver and differing from the frequency of the heterodyning signal of said receiver by said intermediate frequency, an input stage comprising a transistor having a plurality of electrodes, and means coupling said source to one of said electrodes of said transistor, for selectively transmitting from said source to said one electrode a signal having said given frequency and for selectively reducing transmission from said source to said one electrode of a signal having said differing frequency, the improvement wherein said means comprises:

(a) first inductive means and first capacitive means connected in series relationship between said source and said one electrode, said first inductive means comprising means for varying its inductance over a range including the value for which the combination of said first inductive means and said first capacitive means in series-resonant at said given frequency, and (b) reactive means shunting the combination of said first inductive means and said first capacitive means, said reactive means having a value such that the combination of said first inductive means, said first capacitive means and said reactive means is parallel-resonant at approximately said differing frequency when said combination of said first inductive means and said first capacitive means is series-resonant at said given frequency.

19. A superheterodyne receiver according to claim 18, wherein said transistor is connected in common-emitter configuration and said one electrode is the base of said transistor, and said input stage additionally comprises an input capacitor connected between said base electrode and a point at reference potential.

References Cited

UNITED STATES PATENTS 2,285,766 6/1942 Cutting ------------ 325—388

KATHLEEN H. CLAFFY, *Primary Examiner.*

R. S. BELL, *Assistant Examiner.*